United States Patent [19]
Watanabe et al.

[11] Patent Number: 5,548,256
[45] Date of Patent: Aug. 20, 1996

[54] SAW FILTER HAVING ELECTRODES FOR RELAXATION OF ELECTRIC FIELD CONCENTRATION

[75] Inventors: Toru Watanabe; Kenichi Noto, both of Nagaokakyo, Japan

[73] Assignee: Murata Manufacturing Co., Ltd., Japan

[21] Appl. No.: 372,453

[22] Filed: Jan. 13, 1995

[30] Foreign Application Priority Data

Jan. 14, 1994 [JP] Japan .................................. 6-002743

[51] Int. Cl.⁶ .............................. H03H 9/42; H03H 9/64
[52] U.S. Cl. ...................... 333/194; 333/195; 310/313 B
[58] Field of Search ............................ 310/313 R, 313 B, 310/313 C; 333/193, 194, 195, 196

[56] References Cited

U.S. PATENT DOCUMENTS

| | | | |
|---|---|---|---|
| 4,420,728 | 12/1983 | Bower | 333/151 |
| 4,486,724 | 12/1984 | Schofield | 333/194 |
| 4,504,759 | 3/1985 | Schofield | 310/313 C |

*Primary Examiner*—Benny Lee
*Assistant Examiner*—David H. Vu
*Attorney, Agent, or Firm*—Ostrolenk, Faber, Gerb & Soffen, LLP

[57] ABSTRACT

An SAW filter includes an SAW substrate and input and output IDTs which are arranged on the SAW substrate at a prescribed distance from each other. The IDTs are provided on outer end portions along the surface wave propagation direction with electric field concentration relaxation electrodes extending from pairs of bus bars inwardly along oblique directions.

20 Claims, 5 Drawing Sheets

SAW FILTER HAVING ELECTRODES FOR RELAXATION OF ELECTRIC FIELD CONCENTRATION

BACKGROUND OF THE INVENTION

1. Field of the Invention

The present invention relates to an SAW (Surface Acoustic Wave) filter, and more particularly, it relates to an SAW filter which has an improved electrode structure in relation to interdigital transducers (hereinafter referred to as IDTs), thereby having an improved thermal shock resistance.

2. Description of the Background Art

FIG. 1 is a typical plan view showing a conventional SAW filter 1. The SAW filter 1 comprises an SAW substrate 2 which is made of a piezoelectric single crystal such as $LiNbO_3$ or lead zirconate titanate (PZT) piezoelectric ceramics, and input and output IDTs 3 and 4 which are located thereon at a prescribed distance from each other. The IDTs 3 and 4 have pairs of comb electrodes 3a, 3b, 4a and 4b provided with plural electrode fingers which are interdigitated with each other, respectively. These comb electrodes 3a, 3b, 4a and 4b are formed by connecting the plural electrode fingers to bus bars 5 to 8, respectively. The bus bars 5 to 8 are provided on end portions thereof with terminal electrodes 9a, 9b, 10a and 10b for electric connection with the exterior, respectively. Numerals 11 and 12 denote wave absorbing materials which are made of silicone rubber or the like.

In this SAW filter 1, surface waves are excited by an input signal in the input IDT 3, so that the excited surface waves are propagated toward the output IDT 4. An output signal which is based on the propagated surface waves is extracted from the output IDT 4.

The IDTs 3 and 4 are provided with the electrode fingers on end portions along the surface wave propagation direction, while no electrode fingers are provided on the adjacent portion of the SAW substrate 2. Due to such discontinuity between the IDTs 3, 4 and the portion adjacent thereto, an electric field which is generated upon development of a potential difference across the electrode fingers is rendered so discontinuous that the electric field is particularly strong between the electrode fingers provided on the end portions of the IDTs 3 and 4.

When the SAW substrate 2 is made of a pyroelectric material such as $LiNbO_3$ or PZT and charges are generated due to application of a thermal shock, the electrode fingers provided on the end portions of the IDTs 3 and 4 are easily damaged in discharge. Such damage of the electrode fingers on the end portions of the IDTs 3 and 4 is now described with reference to FIG. 2.

FIG. 2 is an enlarged view illustrating such a state that the electrode fingers of the comb electrodes 3a and 3b are damaged in one end portion of the IDT 3. The materials forming the electrode fingers of the comb electrodes 3a and 3b provided on the end portion of the IDT 3 are melted by discharge as shown by arrows A and B, and broken. Even if the electrode fingers are not yet broken by such melting of the materials, the electrode fingers may be roughened similarly to a case of migration.

SUMMARY OF THE INVENTION

An object of the preferred embodiments of the present invention is to provide a highly reliable SAW filter which has excellent thermal shock resistance.

The preferred embodiments of the present invention is directed to an SAW filter comprising an SAW substrate and input and output interdigital transducers which are formed on one major surface of the SAW substrate, and each interdigital transducer has a pair of bus bars of different potentials. The SAW filter further comprises electric field concentration relaxation electrodes extending from the pair of bus bars toward each other in directions obliquely intersecting with the surface wave propagation direction on at least one end portion along the surface wave propagation direction in at least one interdigital transducer. The electric field concentration relaxation electrodes, which are different from electrode fingers forming the interdigital transducer, do not contribute to excitation or electric connection between the electrode fingers and the exterior.

In the SAW filter according to the preferred embodiments of the present invention, the electric field concentration relaxation electrodes are provided to extend from both of the pair of bus bars toward each other in the directions obliquely intersecting with the surface wave propagation direction on an end portion along the surface wave propagation direction in at least one of the IDTs, whereby field concentration is relaxed in the end portion of the IDT.

Also when the SAW substrate is made of a pyroelectric material, therefore, it is possible to relax electric field concentration in the end portion of the IDT by the electric field concentration relaxation electrodes, connected to different potentials, which are arranged in proximity to each other, thereby improving thermal shock resistance. Thus, it is possible to reliably prevent damage of the electrode fingers on the end portion of the IDT, thereby providing an SAW filter which has excellent in reliability.

In the SAW filter according to the preferred embodiments of the present invention, the pair of bus bars may be formed as a hot-side bus bar and a ground-side bus bar.

According to a specific aspect of the preferred embodiments of the present invention, the electric field concentration relaxation electrodes are formed only on an outer end portion along the surface wave propagation direction in at least one IDT. When the electric field concentration relaxation electrodes are formed only on the outer end portion along the surface wave propagation direction in at least one IDT according to this aspect, it is possible to reduce the potential of a harmful effect being exerted on surface wave propagation as compared with a case of forming the electric field concentration relaxation electrodes on an inner end portion of the IDT along the surface wave propagation direction, to thereby form an SAW filter having further stable characteristics.

According to the preferred embodiments of the present invention, the SAW substrate can be made of a suitable piezoelectric material, while the preferred embodiments of the present invention are particularly effective when the SAW substrate which is made of a piezoelectric material exhibiting a high pyroelectric property upon application of a thermal shock. Such a piezoelectric material having a high pyroelectric property can be prepared from a piezoelectric single crystal such as $LiNbO_3$, $LiTaO_3$ or $Li_2B_4O_7$, or PZT-based piezoelectric ceramics, for example. In relation to the piezoelectric single crystal, the preferred embodiments of the present invention are particularly effective when a rotating Y-cut X-propagation piezoelectric single-crystalline substrate is employed, as described later. In this case, the angle of rotation includes all of 0 to 360° excluding 90° and 270°. The preferred embodiments of the present invention are also effectively applied to an SAW substrate which is prepared from a rotating X-cut Y-propagation piezoelectric single-crystalline substrate.

When the SAW substrate is formed by a piezoelectric single-crystalline substrate, the aforementioned cut angle is important. The direction of spontaneous polarization of such a piezoelectric single-crystalline substrate is along its Z-axis, while charges are generated by temperature change also along the z-axis. In relation to the cut angle of a rotating Y-cut X-propagation SAW substrate, vector components of spontaneous polarization are present in a direction not perpendicular but parallel to the electrode fingers when the major surface of the SAW substrate is observed from above. On the other hand, the vector components which are perpendicular to the electrode fingers are substantially canceled in the IDT since the electrode fingers of different potentials are alternately arranged along the surface wave propagation direction, while the vector components which are parallel to the electrode fingers are positioned along a direction for charging the IDT including the bus bars. Due to the problem of such charging, therefore, the preferred embodiments of the present invention are particularly effectively applied to a rotating Y-cut X-propagation piezoelectric single-crystalline substrate. When the SAW substrate is formed by such a piezoelectric single-crystalline substrate having a rotating Y-cut X-propagation cut angle, it is possible to further effectively improve thermal shock resistance by the electric field concentration relaxation electrodes due to a relatively high pyroelectric property.

According to another specific aspect of the preferred embodiments of the present invention, the distance between the electric field concentration relaxation electrodes is made larger than that between the electrode fingers. When the distance between the electric field concentration relaxation electrodes is larger than that between the electrode fingers, no unnecessary waves are excited across the electrodes to exert bad influences on the characteristics, and discharge across the electrodes is relatively loosely performed, whereby the electrode fingers of the IDT will not be fused by a current caused by abrupt discharge.

As hereinabove described, the electric field concentration relaxation electrodes according to the preferred embodiments of the present invention are provided not only for discharging stored charges through addition of such electrodes on the end portion of the IDT but for relaxing electric field concentration on the end portion of the IDT in discharge across the electrode fingers, i.e., for relaxing concentrated discharge on the end portion of the IDT, thereby loosely performing the discharge in the overall IDT. Thus, it is pointed out here that the electric field concentration relaxation electrodes according to the preferred embodiments of the present invention are absolutely different from well-known electrodes, disclosed in Japanese Patent Publication No. 57-53006 (1982), which are added to an IDT at a gap smaller than the distance between electrode fingers forming the IDT merely for the purpose of discharge.

The foregoing and other objects, features, aspects and advantages of the preferred embodiments of the present invention will become more apparent from the following detailed description of the preferred embodiments of the present invention when taken in conjunction with the accompanying drawings.

DESCRIPTION OF THE PREFERRED EMBODIMENTS

Preferred embodiments of the present invention are now described with reference to the drawings, to clarify the present invention.

Figure 3:
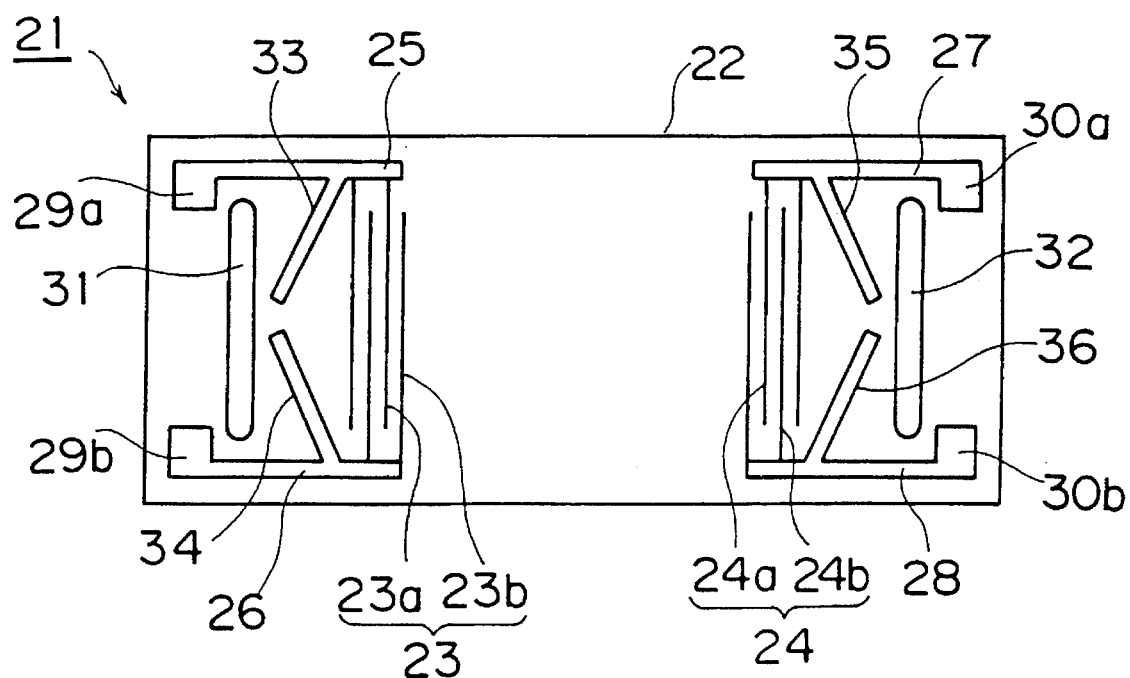
FIG. 3 is a typical plan view showing an SAW filter according to a preferred embodiments of the present invention.

FIG. 3 is a typical plan view showing a surface acoustic wave filter 21 according to a preferred embodiment of the present invention. The surface acoustic wave filter 21 is formed by a rectangular SAW substrate 22. This SAW substrate 22 can be made of a piezoelectric single crystal such as $LiNbO_3$ or $LiTaO_3$ or PZT-based piezoelectric ceramics, for example. Alternatively, the SAW substrate 22 can be prepared by forming a piezoelectric thin film on an insulating substrate. When the SAW substrate 22 is prepared by forming a piezoelectric thin film on an insulating substrate, electrodes such as IDTs described later may be formed under the piezoelectric thin film.

Input and output IDTs 23 and 24 are arranged on the SAW substrate 22 at a prescribed distance from each other.

The IDT 23 is provided with a pair of comb electrodes 23a and 23b having plural electrode fingers which are interdigitated with each other, while the IDT 24 is also provided with a pair of comb electrodes 24a and 24b.

The comb electrode 23a is formed by connecting plural electrode fingers to one bus bar 25 on its one end. Similarly, the comb electrodes 23b, 24a and 24b are also formed by connecting plural electrode fingers to bus bars 26, 27 and 28 on single ends thereof respectively.

The bus bars 25 to 28 are integrally provided on outer end portions thereof with terminal electrodes 29a, 29b, 30a and 30b respectively. The terminal electrodes 29a to 30b, which are employed for electric connection with the exterior, are preferably generally wider than the bus bars 25 to 28.

Numerals 31 and 32 denote wave absorbing materials, which are made of rubber such as silicone rubber or synthetic resin, for example.

The feature of this preferred embodiment resides in that the IDTs 23 and 24 are provided with the electric field concentration relaxation electrodes 33 to 36 on outer end portions along the surface wave propagation direction.

The widths of the electric field concentration relaxation electrodes 33 to 36 are preferably larger than those of the electrode fingers of the comb electrodes 23a, 23b, 24a and 24b forming the IDTs 23 and 24, and preferably close to those of the bus bars 25 to 28, respectively, as shown in FIG. 3. In the IDT 23, the electric field concentration relaxation electrodes 33 and 34 extend toward the bus bars 26 and 25, respectively to obliquely intersect with the surface wave propagation direction, so that forward ends thereof are in proximity to each other. The electric field concentration relaxation electrodes 33 to 36 do not contribute to excitation or electric connection between the electrode fingers and the exterior, unlike to the electrode fingers forming the IDTs 23 and 24. This also applies to the electric field concentration relaxation electrodes 43, 44, 53, 54, 73, 74, 93, 94, 103 and 104 described later, The distance between the forward ends of the electric field concentration relaxation electrodes 33 and 34, i.e., that between the pair of electric field concentration relaxation electrodes 33 and 34, is preferably made larger than that between the electrode fingers of the IDTs 23 and 24 in this preferred embodiment. However, the distance between the electric field concentration relaxation electrodes 33 and 34 may alternatively be smaller than or identical to that between the electrode fingers forming the IDTs 23 and 24.

The electric field concentration relaxation electrodes 35 and 36 which are formed on the end portion of the IDT 24 are formed similarly to the electric field concentration relaxation electrodes 33 and 34 which are structured in the aforementioned manner.

These electric field concentration relaxation electrodes 33 to 36 are preferably formed to have sufficiently large widths and lengths with respect to the wavelength of surface waves as propagated, thereby reliably attaining a electric field concentration relaxation effect described later.

In order to sufficiently attain the electric field concentration relaxation effect described later, the electric field concentration relaxation electrodes 33 to 36 must extend along directions which are oblique to the surface wave propagation direction, i.e., the direction connecting the IDTs 23 and 24 with each other, as shown in FIG. 3. The oblique directions are those intersecting with the surface wave propagation direction, excluding that which is perpendicular to the surface wave propagation direction.

The effect which is attained by addition of the electric field concentration relaxation electrodes 33 to 36 is now described.

Figure 1:
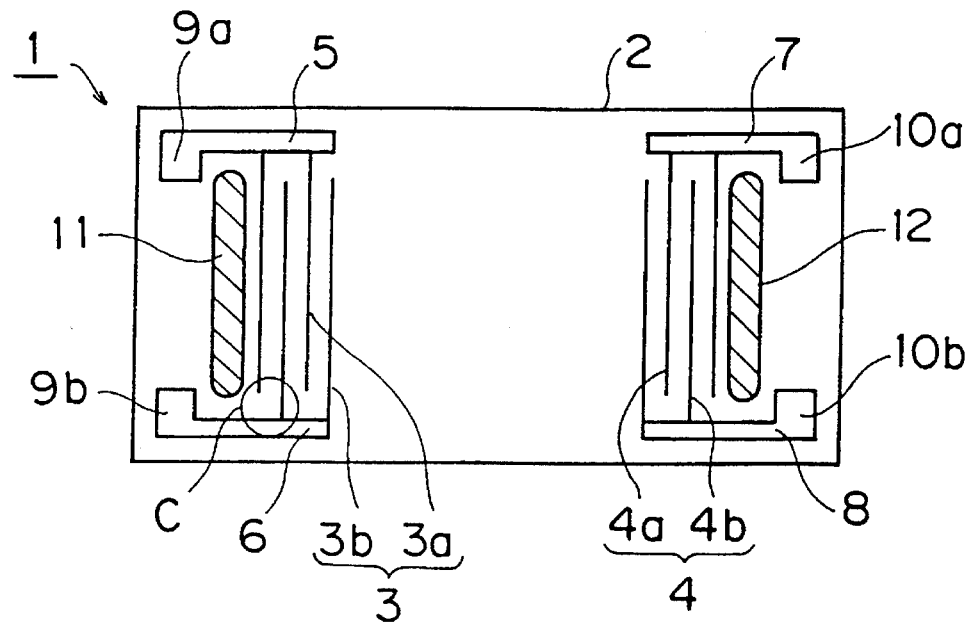
FIG. 1 is a typical plan view for illustrating a conventional SAW filter.
Figure 2:
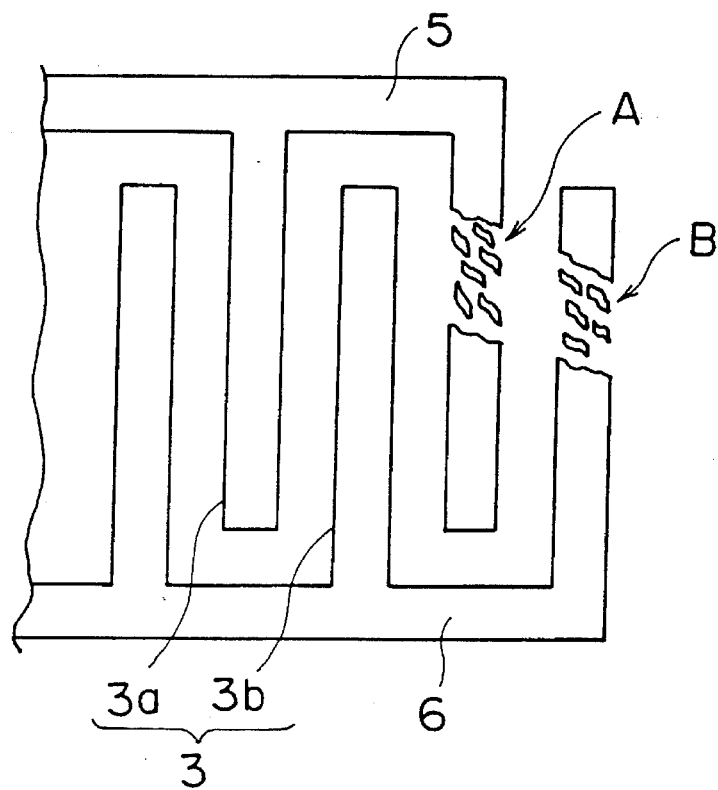
FIG. 2 is a partially fragmented enlarged plan view showing exemplary damage of an IDT.

In the SAW filter 21 provided with the electric field concentration relaxation electrodes 33 to 36 in the aforementioned manner, electric field distribution changes on the outer end portions of the IDTs 23 and 24 are looser as compared with those in the conventional SAW filter 1 shown in FIG. 1. Namely, electric field distribution is loosely inclined as compared with the prior art on the outer end portion of the IDT 23 along the surface wave propagation direction since the electric field concentration relaxation electrodes 33 and 34 which are connected to the bus bars 25 and 26 of different potentials obliquely extend as shown in FIG. 3. Thus, it is possible to prevent damage of the electric fingers provided on the outer end portion of the IDT 23.

Figure 4:
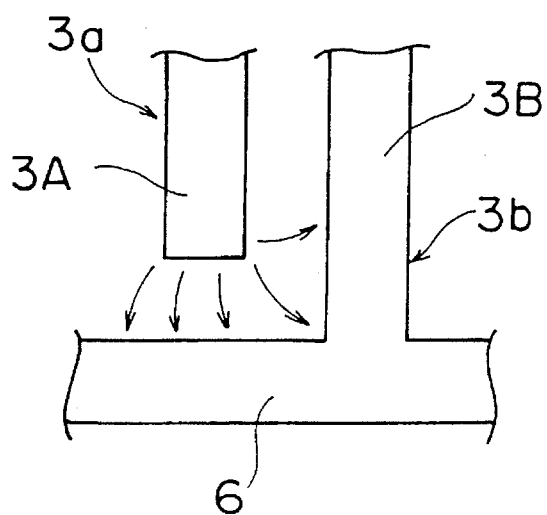
FIG. 4 is a partially fragmented enlarged plan view for illustrating an electric field concentration state on an end portion of an IDT in the prior art.

In the SAW filter 1 shown in FIG. 1, lines of electric force run from an electrode finger 3A provided on the outer end of the comb electrode 3a toward the bus bar 6 and an electrode finger 3B of the comb electrode 3b on the outer end portion of the IDT 3, as shown by arrows in FIG. 4 in an enlarged manner of the area circle C in FIG. 1. Thus, the electrode fingers 3A and 3B are easily damaged by electric field concentration, as hereinabove described.

Figure 5:
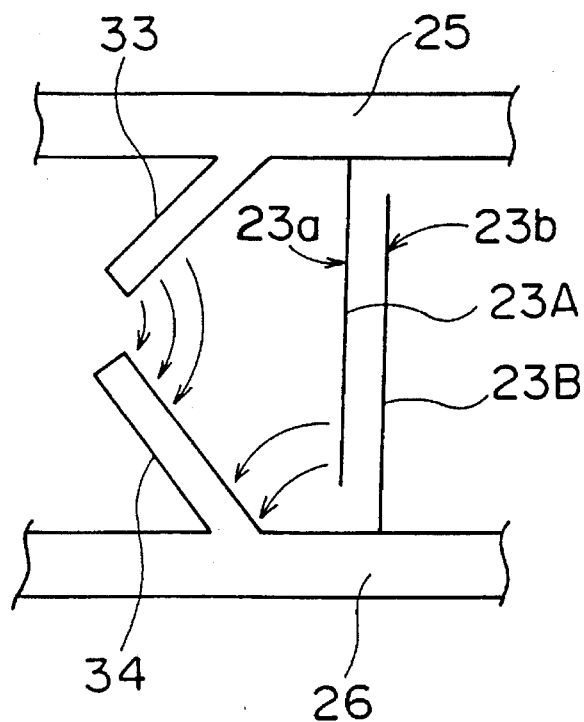
FIG. 5 is a partially fragmented plan view for illustrating the action of the electric field concentration relaxation electrodes in the preferred embodiment.

In the SAW filter 21 according to this preferred embodiment, on the other hand, the electric field concentration relaxation electrodes 33 and 34 which are preferably wider than the electrode fingers of the comb electrodes 23a and 23b are provided as shown in FIG. 5 illustrating the portion provided with the electric field concentration relaxation electrodes 33 and 34 in an enlarged manner. In the vicinity of an electrode finger 23A provided on the outer end portion of the comb electrode 23a, therefore, lines of electric force run not only toward an electrode finger 23B provided on an end portion of the comb electrode 23b but toward the electric field concentration relaxation electrode 34 as shown by arrows in FIG. 5, while lines of electric force also run from the electric field concentration relaxation electrode 33 toward the electric field concentration relaxation electrode 34 as shown by arrows in FIG. 5. As a result, electric field concentration is relaxed on the outer end portion of the IDT 23. Further, the electric field concentration relaxation electrodes 33 and 34 are sufficiently wider than the wavelength of the surface waves as described above, whereby the same are hardly damaged by the electric field concentration.

In addition, the electric field concentration relaxation electrodes 33 and 34 extend to obliquely intersect with the surface wave propagation direction, whereby the IDTs 23 and 24 hardly receive reflected waves even if the electric field concentration relaxation electrodes 33 and 34 reflect propagated surface waves. Thus, the reflected waves hardly exert bad influences on the characteristics of the filter 21.

Further, the electric field concentration relaxation electrodes 33 and 34 are sufficiently separated from the comb electrodes 23a and 23b of the IDT 23 which are connected to different potentials, whereby undesired wave excitation is hardly caused by provision of the electrodes 33 and 34.

While single electrode fingers of the IDTs 23 and 24 are alternately interdigitated with each other in the aforementioned preferred embodiment, each electrode finger may alternatively be formed by a double-finger type one having two fingers which are disposed substantially parallel with each other.

The bus bars 25 and 26 may be employed as a hot-side bar, and a ground-side bus bar respectively, and this also applies to the bus bars 27 and 28. However, it is not necessary to employ the bus bars 25, 26, 27 and 28 as hot-side and ground-side bus bars.

Figure 6:
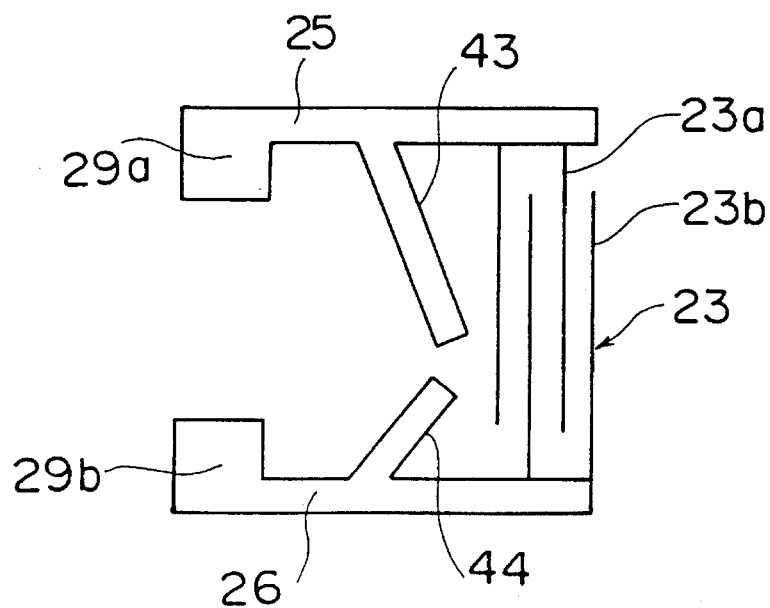
FIG. 6 is a typical plan view for illustrating the electric field concentration relaxation electrodes in a first modified preferred embodiment.

FIG. 6 is an enlarged plan view for illustrating a modification of the electric field concentration relaxation electrodes 33 and 34. In the preferred embodiment shown in FIG. 3, the electric field concentration relaxation electrodes 33 and 34, extending from the bus bars 25 and 26 to central regions toward each other, are substantially identical in length to each other. However, electric field concentration relaxation electrodes 43 and 44 may be different in length from each other, as shown in FIG. 6. As clearly understood from FIG. 6, further, the electric field concentration relaxation electrodes 43 and 44 may extend from bus bars 25 and 26 not outwardly along the surface wave propagation direction, but obliquely toward an IDT 23.

Figure 7:
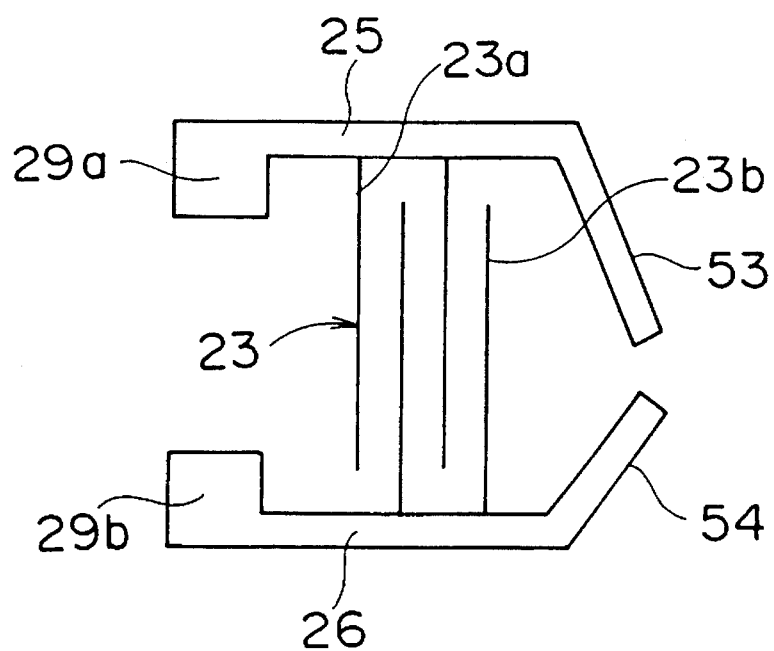
FIG. 7 is a typical plan view for illustrating the electric field concentration relaxation electrodes in a second modified preferred embodiment.

As shown in FIG. 7, on the other hand, electric field concentration relaxation electrodes 53 and 54 may be arranged on an inner end portion of an IDT 23 along the surface wave propagation direction. Also in this case, the electric field concentration relaxation electrodes 53 and 54 may extend not to separate from the IDT 23 but toward the same, as shown in FIG. 7.

Figure 8:
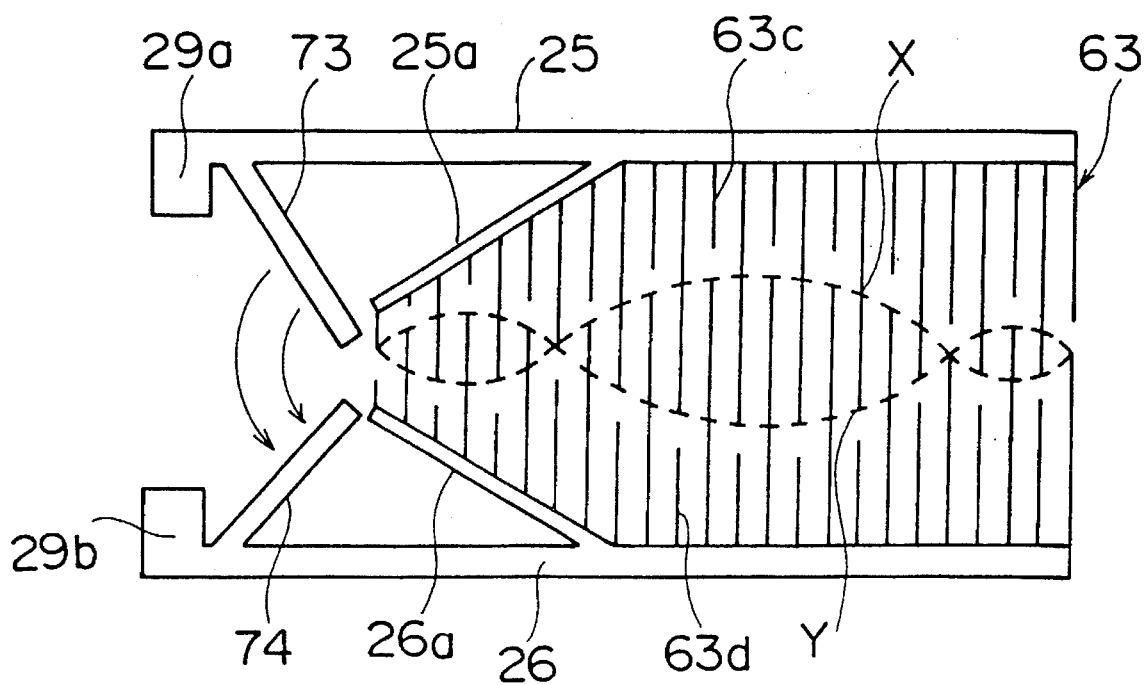
FIG. 8 is a typical plan view of a third modified preferred embodiment having an IDT which is weighted to have a plurality of vibration sources.

While the IDTs 23 and 24 of the SAW filter 21 according to the embodiment shown in FIG. 3 are formed by normal form IDTs, the present invention is also applicable to an SAW filter having a weighted IDT 63, as shown in FIG. 8. FIG. 8 is a typical plan view showing a portion provided with the preferred IDT 63 in an enlarged manner, and the preferred embodiment of the IDT 63 is weighted by cross width weighting for forming a vibration source shown by broken envelopes X and Y in FIG. 8. Numerals 63c and 63d denote dummy electrode fingers.

In the IDT 63, branch bus bars 25a and 26a are arranged to extend from bus bars 25 and 26 toward a central portion, in order to form the vibration source which is enclosed with the envelopes X and Y on an outer side along the surface wave propagation direction. Electric field concentration relaxation electrodes 73 and 74 are arranged to extend toward the IDT 63 on an outer end portion along the surface wave propagation direction. Therefore, lines of electric force run from the electric field concentration relaxation electrode 73 toward the electric field concentration relaxation electrode 74 as shown by arrows in FIG. 8, whereby electrode fingers of the IDT 63 can be prevented from damage on the outer end portion along the surface wave propagation direction. In this case, forward ends of the electric field concentration relaxation electrodes 73 and 74 may be connected with the branch bus bars 25a and 26a, respectively.

Figure 9:
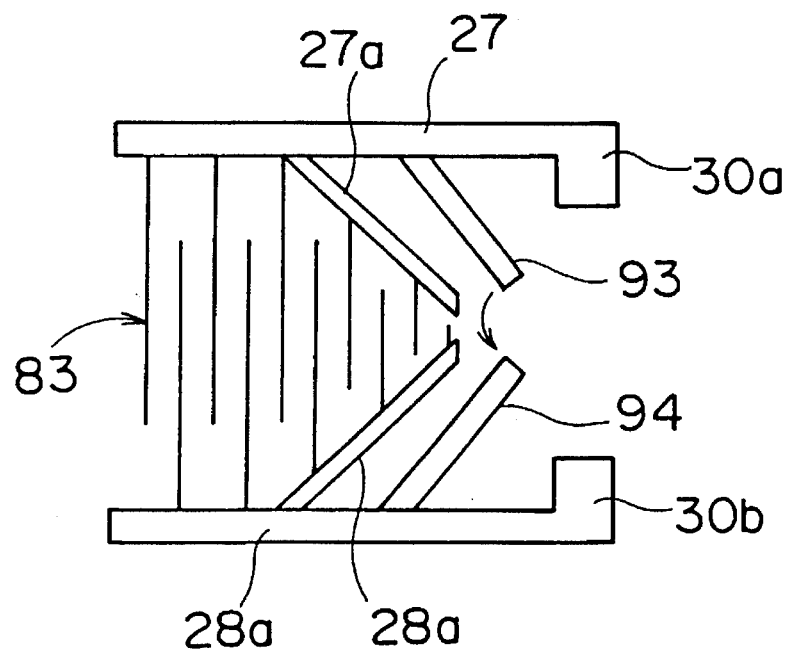
FIG. 9 is a typical plan view for illustrating the electric field concentration relaxation electrodes in a fourth modified preferred embodiment.

As shown in FIG. 9, on the other hand, electric field concentration relaxation electrodes 93 and 94 may be formed to outwardly extend from bus bars 27 and 28 along the surface wave propagation direction of a weighted IDT 83.

Figure 10:
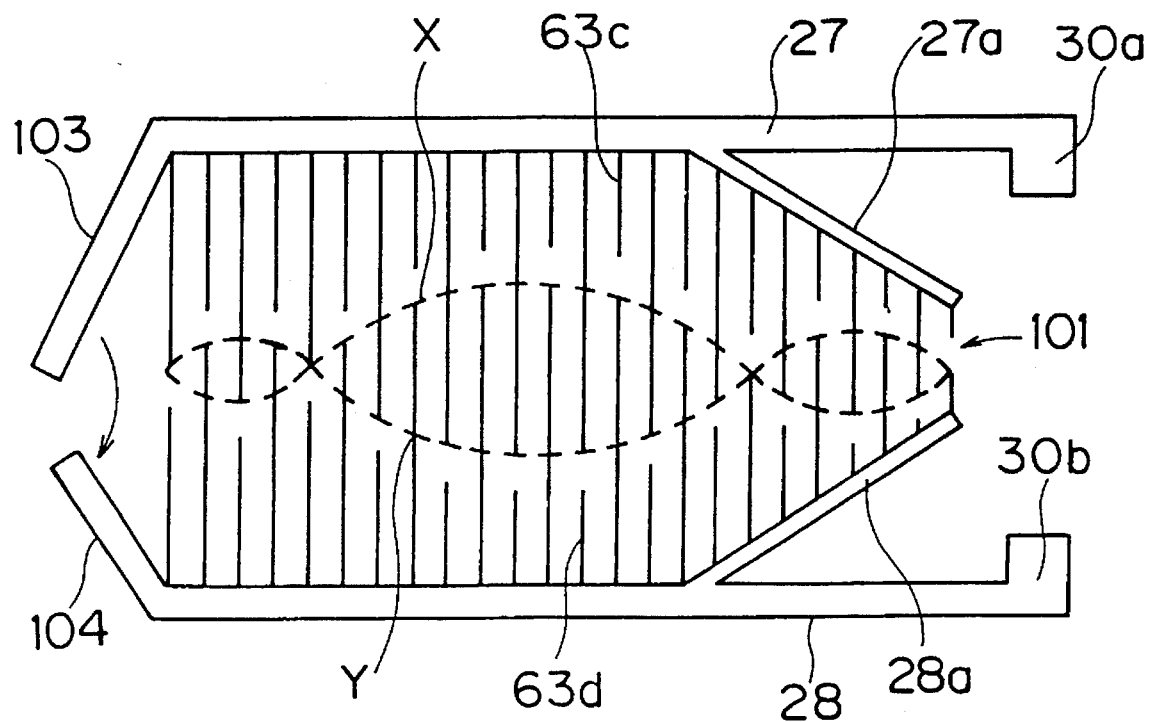
FIG. 10 is a typical plan view for illustrating the electric field concentration relaxation electrodes in a fifth modified preferred embodiment.

As shown in FIG. 10, further, electric field concentration relaxation electrodes 103 and 104 may be formed to obliquely extend from bus bars 27 and 28 inwardly along the surface wave propagation direction on an inner end portion of a weighted IDT 101 along the surface wave propagation direction. The IDT 101 has electrode fingers which are similar in structure to those of the modification shown in FIG. 8.

While the electric field concentration relaxation electrodes are formed on one end portion of each IDT along the surface wave propagation direction in each of the preferred embodiment and the modifications, the electrodes may alternatively be arranged on both ends of each IDT along the surface wave propagation direction.

While both of the IDTs 23 and 24 are provided with the electric field concentration relaxation electrodes 33, 34, 35 and 36 in the preferred embodiment shown in FIG. 3, the electric field concentration relaxation electrodes may alternatively be provided only on one of the IDTs.

As clearly understood from the preferred embodiment and the modifications described above, the IDTs provided in the inventive SAW filter are not restricted to normal ones but may be formed by various type IDTs such as those weighted in a cross width manner, those having dummy electrode fingers, and double-finger type ones.

Further, the inventive SAW filter, which is adapted to prevent damage of the electrode fingers provided on the end portion(s) of the IDT(s) by provision of the electric field concentration relaxation electrodes as described above, can be preferably employed when the SAW substrate is made of a piezoelectric material having a pyroelectric property such as a piezoelectric single crystal of LiNbO$_3$ or PZT-based piezoelectric ceramics, in particular. Namely, it is possible to effectively prevent damage of the electrode fingers by a pyroelectric effect of the SAW substrate which is made of such a pyroelectric material.

An Example of the preferred embodiments of the present invention is now described.

The IDT 24 of the SAW filter 21 shown in FIG. 3 was replaced by the IDT 63 shown in FIG. 8, and the SAW substrate 22 was prepared from a 128° rotating Y-cut X-propagation LiNbO$_3$ substrate, to form 10 samples of an SAW filter according to the Example having a central frequency of 402 MHz. For the purpose of comparison, 10 samples of an SAW filter according to comparative example were prepared similarly to the above, except that no electric field concentration relaxation electrodes 33, 34, 73 and 74 were provided.

The SAW filters according to the Example and comparative example were subjected to a thermal shock test of repeating a cycle of leaving the filters under a temperature of −55° C. for 30 minutes and thereafter leaving the same under a temperature of +85° C. for 30 minutes. This thermal shock cycle was repeated 200 times, for evaluating rates of damage of the IDTs. Table 1 shows the results. Table 1 also shows changes of bandwidths and central frequencies $f_o$ through the thermal shock test.

TABLE 1

|  | Bandwidth | $f_o$ | Rate of IDT's Damage |
|---|---|---|---|
| Comparative Example | reduced by 6 MHz | increased by 1.7 MHz | 10/10 |
| Example | reduced by 0.5 MHz | increased by 0.3 MHz | 0/10 |

As understood from Table 1, the IDTs were damaged in all of the 10 samples in the SAW filter according to comparative example, while the IDTs were not damaged in the samples of the SAW filter according to the Example. It is also understood that changes of the bandwidths and the central frequencies were remarkably reduced in the samples of the SAW filter according to the Example.

It has been confirmed that the changes of the bandwidths and the central frequencies in the samples according to the Example were equivalent to those in an ordinary high temperature storage test. Thus, it is conceivable that the characteristics of these samples were changed simply by aging.

Although the present invention has been described and illustrated in detail, it is clearly understood that the preferred embodiment of the same is by way of illustration and example only add is not to be taken by way of limitation, the spirit and scope of the preferred embodiments of the present invention being limited only by the terms of the appended claims.

What is claimed is:

1. A SAW filter comprising:
    an SAW substrate;
    input and output interdigital transducers located on one major surface of said SAW substrate, each said interdigital transducer including a plurality of interdigitated electrode fingers and a pair of bus bars of different potentials; and
    at least one pair of electric field concentration relaxation electrodes being arranged on said SAW substrate so as to be physically spaced and separate from the electrode fingers of the input and output interdigital transducers and extending from respective ones of said pair of bus bars toward each other in directions obliquely intersecting with a surface wave propagation direction on at least one end portion along said surface wave propagation direction in at least one of said input and output interdigital transducers.

2. The SAW filter in accordance with claim 1, wherein each said pair of bus bars include a hot-side bus bar and a ground-side bus bar.

3. The SAW filter in accordance with claim 2, wherein said SAW substrate is formed by a rotating Y-cut X-propagation piezoelectric single-crystalline substrate.

4. The SAW filter in accordance with claim 3, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

5. The SAW filter in accordance with claim 2, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

6. The SAW filter in accordance with claim 1, wherein said at least one pair of electric field concentration relaxation electrodes is disposed only on an outer end portion along said surface wave propagation direction in said at least one of said input and output interdigital transducers.

7. The SAW filter in accordance with claim 6, wherein said SAW substrate is formed by a rotating Y-cut X-propagation piezoelectric single-crystalline substrate.

8. The SAW filter in accordance with claim 7, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

9. The SAW filter in accordance with claim 6, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

10. The SAW filter in accordance with claim 1, further comprising at least two pair of said electric field concentration relaxation electrodes being disposed on both end portions along said surface wave propagation direction in said at least one of said input and output interdigital transducers.

11. The SAW filter in accordance with claim 10, wherein said SAW substrate is formed by a rotating Y-cut X-propagation piezoelectric single-crystalline substrate.

12. The SAW filter in accordance with claim 11, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

13. The SAW filter in accordance with claim 10, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

14. The SAW filter in accordance with claim 1, wherein said SAW substrate is formed by a rotating Y-cut X-propagation piezoelectric single-crystalline substrate.

15. The SAW filter in accordance with claim 14, wherein each of said pair of electric field concentration relaxation electrodes includes a free end and an opposite end connected one of said pair of bus bars, the distance between the free ends of said pair of electric field concentration relaxation electrodes is larger than that between said electrode fingers forming said interdigital transducer provided with said electric field concentration relaxation electrodes.

16. The SAW filter in accordance with claim 1, wherein each of said pair of electric field concentration relaxation electrodes includes a free end and an opposite end connected one of said pair of bus bars, the distance between the free ends of said pair of electric field concentration relaxation electrodes is larger than a distance between said electrode fingers forming said interdigital transducer provided with said electric field concentration relaxation electrodes.

17. A SAW filter comprising:

an SAW substrate;

at least one input interdigital transducer and at least one output interdigital transducer located on the SAW substrate, each of the at least one input interdigital transducer and the at least one output interdigital transducer including a plurality of interdigitated electrode fingers and a pair of bus bars; and at least one pair of electric field concentration relaxation electrodes located on the SAW substrate so as to be physically separate and spaced from the electrode fingers, the electric field concentration relaxation electrodes being adapted and arranged to relax the electric field concentration at one of the input and output interdigital transducers.

18. The SAW filter of claim 17, wherein the at least one pair of electric field concentration relaxation electrodes are arranged on the SAW substrate so as to be connected to respective ones of the pair of bus bars and so as to extend toward each other in directions obliquely intersecting with a surface wave propagation direction.

19. A SAW filter comprising:

an SAW substrate;

at least one input interdigital transducer and at least one output interdigital transducer located on the SAW substrate, each of the at least one input interdigital transducer and the at least one output interdigital transducer including a plurality of interdigitated electrode fingers and a pair of bus bars; and at least one pair of electric field concentration relaxation electrodes located on the SAW substrate so as to be physically separate and spaced from the electrode fingers, the electric field concentration relaxation electrodes being adapted and arranged to cause lines of electric force to run from at least one of the electrode fingers of one of the input and output interdigital transducers toward the electric field concentration relaxation electrodes and to cause lines of electric force to run from one of the pair of electric field concentration relaxation electrodes to the other of the pair of electric field concentration relaxation electrodes.

20. The SAW filter in accordance with claim 19, wherein each of the pair of electric field concentration relaxation electrodes includes a free end and an opposite end connected one of the pair of bus bars, the distance between the free ends of the pair of electric field concentration relaxation electrodes is larger than a distance between the electrode fingers forming the interdigital transducer provided with the electric field concentration relaxation electrodes.

* * * * *